US009923027B2

United States Patent
Chiu et al.

(10) Patent No.: US 9,923,027 B2
(45) Date of Patent: Mar. 20, 2018

(54) STRUCTURE AND METHOD FOR MEMORY CELL ARRAY

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Shengfen Chiu, Shanghai (CN); Heng Cao, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/624,865

(22) Filed: Jun. 16, 2017

(65) Prior Publication Data
US 2018/0006086 A1    Jan. 4, 2018

(30) Foreign Application Priority Data
Jul. 4, 2016    (CN) .......................... 2016 1 0518865

(51) Int. Cl.
H01L 27/24    (2006.01)
H01L 27/22    (2006.01)
H01L 29/861   (2006.01)

(52) U.S. Cl.
CPC ........ H01L 27/2409 (2013.01); H01L 27/224 (2013.01); H01L 29/861 (2013.01)

(58) Field of Classification Search
CPC ............... H01L 27/224; H01L 27/2409; H01L 27/2463; H01L 27/2472; H01L 45/04–45/1691
See application file for complete search history.

(56) References Cited

U.S. PATENT DOCUMENTS 5,640,343 A  *  6/1997  Gallagher .............. B82Y 10/00
                                                  257/E21.665
9,019,742 B2 *  4/2015  Chung ................ G11C 11/5678
                                                      365/148

(Continued)

FOREIGN PATENT DOCUMENTS

EP    3232441      10/2017
WO    2010080437   7/2010

OTHER PUBLICATIONS

European Application No. 17179530.5, Extended European Search Report dated Dec. 12, 2017, 6 pages.

Primary Examiner — Bryan Junge
(74) Attorney, Agent, or Firm — Kilpatrick Townsend & Stockton LLP

(57) ABSTRACT

A memory cell array structure includes memory cells arranged in m rows and n columns on a substrate, and n columns of first and second well regions with different conductivity types alternatively arranged along the column direction. Each of the memory cells includes first and second diodes. The first diode formed of a first doped region in the same column is disposed in the first well region. The second diode formed of a second doped region in the same column is disposed in the second well region. A third doped region having the conductivity type of the first well region is disposed in the first well region and is connected to the reset line of the same column. A fourth doped region having the conductivity type of the second well region is disposed in the second well region and is connected to the bit line of the same column.

20 Claims, 7 Drawing Sheets

(56) References Cited

U.S. PATENT DOCUMENTS

| | | |
|---|---|---|
| 2009/0180310 A1 | 7/2009 | Shimomura et al. |
| 2009/0185410 A1 | 7/2009 | Huai et al. |
| 2009/0316467 A1* | 12/2009 | Liu ............... G11C 13/003 365/105 |
| 2010/0117048 A1* | 5/2010 | Lung ............. G11C 13/0004 257/4 |
| 2010/0118602 A1* | 5/2010 | Carter ............. G11C 5/063 365/171 |
| 2010/0200830 A1* | 8/2010 | Liu ............... G11C 11/5678 257/4 |
| 2012/0044739 A1* | 2/2012 | Chung ........... G11C 11/1659 365/96 |
| 2013/0200488 A1 | 8/2013 | Chung |

\* cited by examiner

STRUCTURE AND METHOD FOR MEMORY CELL ARRAY

CROSS-REFERENCES TO RELATED APPLICATIONS

This application claims priority to Chinese Application No. 201610518865.6, filed on Jul. 4, 2016 with the State Intellectual Property Office of People's Republic of China, the content of which is incorporated herein by reference in its entirety.

FIELD OF THE INVENTION

The present invention relates to semiconductor memory devices. More particularly, embodiments of the present invention provide a memory cell array structure, an electronic device including the same, and a method of manufacturing the same.

BACKGROUND OF THE INVENTION

Resistive random access memory (RRAM) devices are widely used in electronic appliances as nonvolatile memory devices due to their many advantages, such as fast read/write access times, a large number of times of read/write operations, long data retention time, small unit area, multi-value storage, and others. The electrical resistance of a resistive random access memory may vary with an applied voltage or current to a bottom electrode, exhibiting a low resistance and a high resistance for storing a logic "0" and a logic "1".

A resistive random access memory (RRAM) unit generally requires a selector to eliminate the sneak leakage path. An NMOS transistor or a PN diode is generally used as a RRAM selector, which is referred to as a 1T1R or 1D1R structure. The 1T1R structure of the RRAM unit includes a transistor and an RRAM, and the 1D1R structure includes a PN diode and an RRAM. The RRAM selector requires a high SET and RESET current, a small size, a relatively high breakdown voltage, and low leakage current. However, as technology nodes are reduced to 40 nm and below, the 1T1R and 1D1R structures cannot meet these requirements.

A 1D1R structure of a RAM cell is a unipolar/nonpolar cell, however, a conventional RRAM cell is bipolar, that is, it needs to pass a high forward current to implement the SET operation and a high reverse current to implement the RESET operation, however, a diode can only provide a high current in one direction.

Therefore, in order to implement a bipolar RRAM having a high current and a low leakage current, a 2D1R (including two diodes and one RRAM) structure has been proposed for an RRAM memory cell array. A layout design of the 2D1R RRAM memory cell array in a silicon substrate for minimizing the size of the memory cell array structure is one of the technical problems that are currently under study.

BRIEF SUMMARY OF THE INVENTION

In an effort to solve the aforementioned needs, embodiments of the present invention provide a memory cell array structure, device and method of manufacturing the same to reduce the size of a memory cell array structure, the sneak current, and increase the switching speed of the 2D1R structure while utilizing standard CMOS processes without major modifications.

Embodiments of the present invention provide a memory cell array structure. The memory cell array structure includes a semiconductor substrate, a plurality of memory cells arranged in m rows and n columns on the semiconductor substrate, m and n being positive integers, each of the memory cells including a first diode, a second diode, and a random access memory component, n columns of first well regions and n columns of second well regions spaced apart from each other in the semiconductor substrate and alternatively disposed along a column direction, the first well regions having a first conductivity type, and the second well regions having a second conductivity type different from the first conductivity type, m rows of first doped regions in the first well regions and having the second conductivity type, each one of first doped regions disposed in one of the first well regions along the column direction, one of the first doped regions and one of the first well regions disposed underneath thereof forming a first diode, and m rows of second doped regions in the second well regions and having the first conductivity type, each one of second doped regions disposed in one of the second well regions along the column direction, one of the second doped regions and one of the second well regions disposed underneath thereof forming a second diode. The memory cell array structure further includes a plurality of third doping regions having the first conductivity type of the first well regions, at least one of the third doped regions disposed in one of the first well regions, and the third doped regions being isolated from adjacent first doped regions, a plurality of fourth doping regions having the second conductivity type of the second well regions, at least one of the fourth doped regions disposed in one of the second well regions, and the fourth doped regions being isolated from adjacent second doped regions, and a plurality of random access memory components disposed on the semiconductor substrate, each of the random access memory components having a bottom electrically connected to one of the first doped regions and one of the second doped regions. The memory cell array structure also includes m rows of word lines on the random access memory components, spaced apart from each other and parallel to each other, each of the random access memory components having a top electrically connected to a same word line, n columns of reset lines each on third doped region in a same column and electrically connected to the third doped regions in the same column and underneath thereof, the rest lines being isolated from each other, and n columns of bit lines each on fourth doped regions in a same column and electrically connected to the fourth doped regions in the same column and underneath thereof, the bit lines being isolated from each other.

In one embodiment, one of the third doped regions in one of the first well regions is disposed at one end of the one of the first well regions.

In one embodiment, one of the fourth doped regions in one of the second well regions is disposed at one end of the one of the second well regions.

In one embodiment, the third doped regions and the fourth doped regions are alternatively arranged in the row direction.

In one embodiment, the memory cell array structure further includes a deep trench isolation structure between adjacent first well regions and second well regions, the deep trench isolation structure extending along the column direction in the semiconductor substrate and having a bottom lower than a bottom of the first well regions and a bottom of the second well regions.

In one embodiment, the memory cell array structure further includes a shallow trench isolation structure between adjacent first doped regions in a same first well region, between adjacent third doped regions and first doped regions, between adjacent second doped regions in a same second well region, and between the fourth doped regions and the second doped regions, the shallow trench isolation structure having a bottom higher than a bottom of the first well regions and a bottom of the second well regions.

In one embodiment, the memory cell array structure further includes an isolation well region having the second conductivity type, the isolation well region being disposed below the first well regions and the second well regions.

In one embodiment, the isolation well region has an upper portion adjacent to a bottom of the first well regions and a bottom of the second well regions.

In one embodiment, the n columns of reset lines each extend along the column direction toward an outer edge of the memory cell array structure.

In one embodiment, the n columns of bit lines each extend along the column direction toward an outer edge of the memory cell array structure.

In one embodiment, the first conductivity type is P-type and the second conductivity type is N-type; or, the first conductivity type is N-type and the second conductivity type is P-type.

In one embodiment, the random access memory component is one of a resistive random access memory, a phase-charge random access memory, or a magnetic random access memory.

In one embodiment, the memory cell array structure further includes an interconnect metal layer disposed on the semiconductor substrate and below the random access memory component and electrically connected to a bottom of the random access memory component, a first contact hole and a second contact hole below the interconnect metal layer and isolated from each other. The first contact hole is electrically connected between one of the first doped regions and the interconnect metal layer, and the second contact hole is electrically connected between one of the second doped regions and the interconnect metal layer.

In one embodiment, the interconnect metal layer is electrically connected to different ones of the random access memory components.

In one embodiment, each of the reset lines is electrically connected to a corresponding third doped region disposed underneath thereof through a third contact hole on the semiconductor substrate.

In one embodiment, each of the bit lines is electrically connected to a corresponding fourth doped region disposed underneath thereof through a fourth contact hole on the semiconductor substrate.

In one embodiment, the reset lines and the bit lines are parallel to each other.

In one embodiment, the semiconductor substrate has the first conductivity type.

In one embodiment, the memory cell array structure further includes an isolation well region having the second conductivity type disposed below the first well regions and configured to isolate the first well regions from the semiconductor substrate.

Embodiments of the present invention also provide an electronic device including the above-described memory cell array structure.

The following description, together with the accompanying drawings, will provide a better understanding of the nature and advantages of the claimed invention.

DETAILED DESCRIPTION OF THE INVENTION

Figure 1:
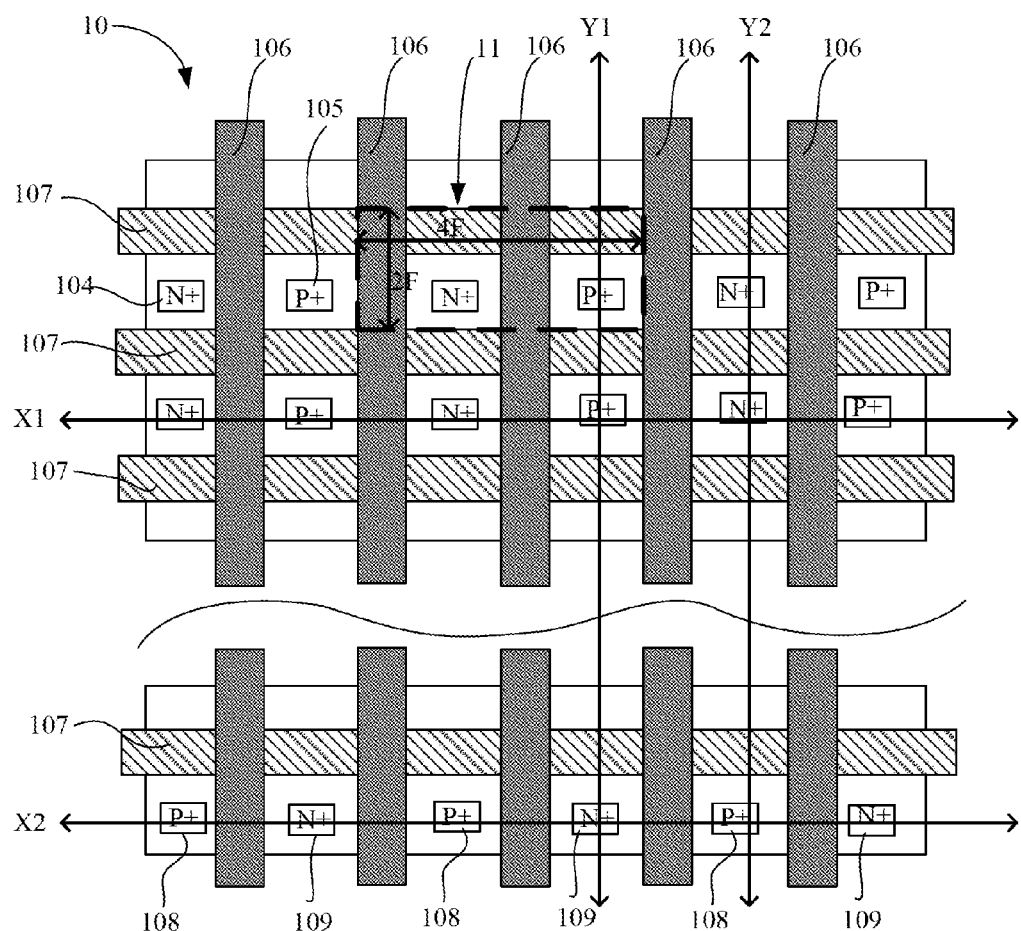
FIG. 1 is a top view of a memory cell array structure according to one embodiment of the present invention.

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

In the following detailed description, reference is made to the accompanying drawings which form a part hereof, and in which is shown by way of illustration specific embodiments in which the invention may be implemented. The term "upper", "lower", "vertical", "horizontal", "depth", "height", "width", "top", "bottom", etc., is used with reference to the orientation of the Figures being described. Because components of embodiments of the present invention can be positioned in a number of different orientations, the term is used for purposes of illustration and is not limiting. It will be understood that these terms are intended to encompass different orientations of the device in addition to the orientation depicted in the figures.

It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "underneath", "below", "above", "higher", "lower", "over" and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

The N+ (or n+) layer is highly doped with impurities to a concentration of at least $10E18 (10^{18})$ atoms per $cm^3$ or a dose of at least $10E14 (10^{14})$ atoms per $cm^2$. The N− (or n−) layer has a lower doping concentration, but is still an n-type and has an impurity concentration in the range of $10E14$ $(10^{14})$ to $10E15 (10^{15})$ atoms per $cm^3$ or a dose of $10E10$ to $10E11$ ($10^{10}$ to $10^{11}$) atoms per $cm^2$. The P (or p) layer is lightly doped with impurities to a concentration in the range of $10E14$ ($10^{14}$) to $10E15$ ($10^{15}$) atoms per $cm^3$ or a dose of $10E10$ to $10E11$ ($10^{10}$ to $10^{11}$) atoms per $cm^2$. The P+ (or p+) layer is highly doped with impurities to a concentration of at least $10E18$ ($10^{18}$) atoms per $cm^3$ or a dose of at least $10E14$ ($10^{14}$) atoms per $cm^2$.

Embodiments of the invention are described herein with reference to cross-seg tional illustrations that are schematic illustrations of idealized embodiments (and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Embodiments of the present invention now will be described more fully hereinafter with reference to the accompanying drawings, in which embodiments of the invention are shown. This invention may, however, be embodied in many different forms and should not be construed as limited to the embodiments set forth herein.

In order to realize the layout of a 2D1R RRAM cell array in a semiconductor substrate (e.g., silicon substrate) and minimize the size of the memory cell array, embodiments of the present invention provide a memory cell array structure comprising a semiconductor substrate, a plurality of memory cells arranged in m rows and n columns on the semiconductor substrate, where m and n are positive integers. Each of the memory cells includes a first diode, a second diode, and a random access memory cell component.

The memory cell array structure also includes n rows of first well regions and n rows of second well regions each extending along the direction of the column, the n rows of first and second well regions are alternatively disposed in the semiconductor substrate along the direction of the row. The first well region has a first conductivity type, and the second well region has a second conductivity type different from the first conductivity type.

The memory cell array structure also includes a plurality of first doped regions disposed in the first well regions and having the second conductivity type. A number m of first doped regions are arranged at a first predetermined space interval along the column direction in the first well regions, one of the first doped regions and one first well region below the corresponding one of the first doped regions form a first diode.

The memory cell array structure also includes a plurality of second doped regions disposed in the second well regions and having the first conductivity type. A number m of second doped regions are arranged at a second predetermined space interval along the column direction in the first well regions, one of the second doped regions and one second well region below the corresponding one of the second doped regions form a second diode.

The memory cell array structure also includes a plurality of random access memory components disposed on the semiconductor substrate, the bottom of each of the random access memory components is electrically connected to one of the first doped regions and one of the second doped regions of a corresponding memory cell.

The memory cell array structure also includes m rows of word lines disposed above the random access memory components and parallel to each other, the top of the random access memory components of the memory cell array disposed on the same row is electrically connected to the same word line.

The memory cell array structure also includes a plurality of third doped regions having the same conductivity type as that of the first well regions, at least one third doped region is provided in one of the first well regions, the third doped regions and the adjacent first doped regions are separated from each other.

The memory cell array structure also includes a plurality of fourth doped regions having the same conductivity type as that of the second well regions, at least one fourth doped region is provided in one of the second well regions, the fourth doped regions and adjacent second doped regions are separated from each other.

The memory cell array structure also includes n columns of reset lines disposed above the third doped regions, the n columns of reset lines are isolated from each other, each column of the reset lines is electrically connected to the corresponding third doped region disposed underneath thereof.

The memory cell array structure also includes n columns of bit lines disposed above the fourth doped regions, the n columns of bit lines are isolated from each other, each column of the bit lines is electrically connected to the corresponding fourth doped region disposed underneath thereof.

The memory cell array structure according to one embodiment of the present invention includes m rows and n columns of memory cells formed in a semiconductor substrate. The first well region of the same column of memory cell serves as the bit line of that column, where the first well region of the same memory cell is a lead out to electrically connect to a bit line above thereof through the third doped region in the first well region. The second well region of the same column of memory cells is provided as a reset line of the column in which the fourth well region of the second well region disposed in each of the second well regions is electrically connected to the reset line. The memory cell array structure directly uses the first well region and the second well region in the semiconductor substrate as the bit line and the reset line, respectively, to reduce the area of the bit line and the reset line on the semiconductor substrate, so that the size of the memory cell array structure can be significantly reduced while ensuring the performance of the memory cell array structure.

Embodiment 1

Figure 2A:
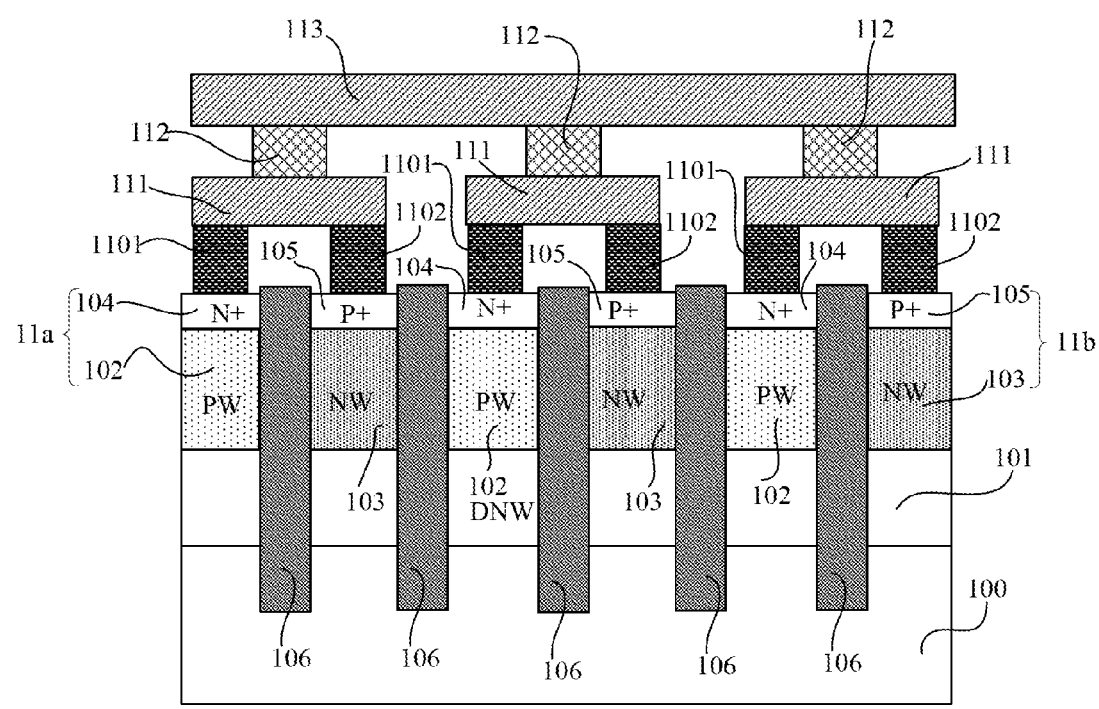
FIG. 2A illustrate a simplified cross-sectional view of the memory cell array structure taken along the line X1 of FIG. 1 according to one embodiment of the present invention.
Figure 2B:
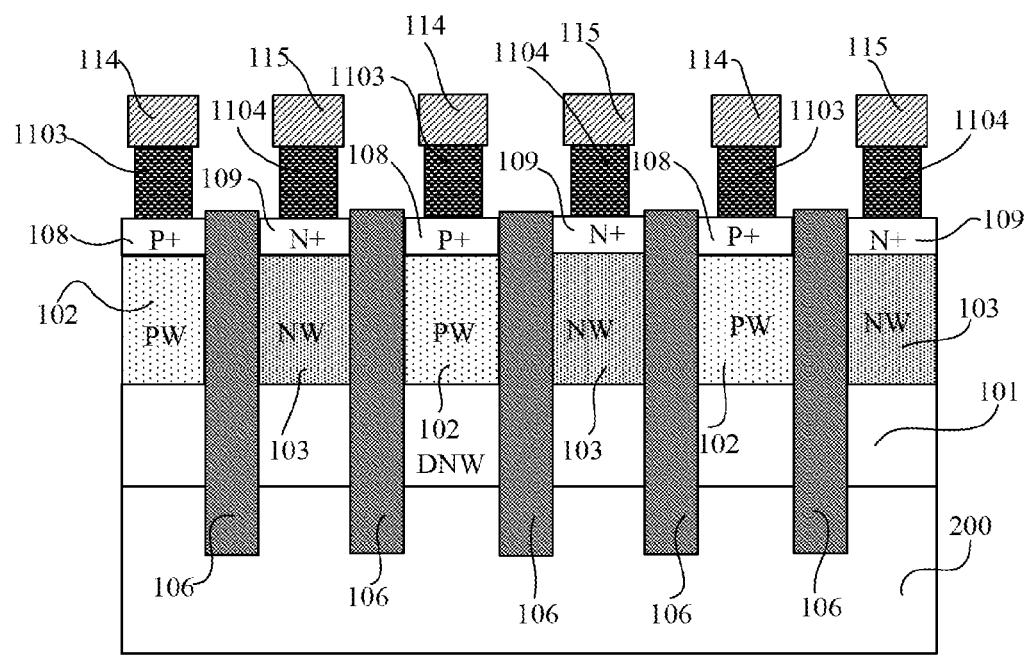
FIG. 2B illustrate a simplified cross-sectional view of the memory cell array structure taken along the line X2 of FIG. 1 according to one embodiment of the present invention.
Figure 2C:
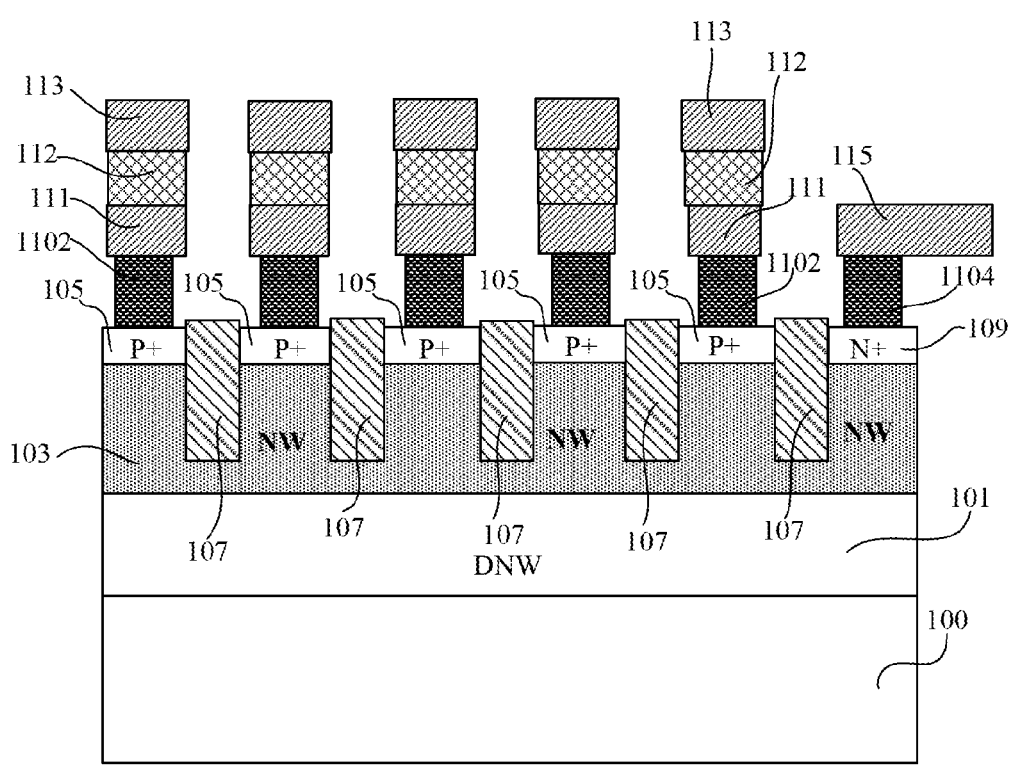
FIG. 2C illustrate a simplified cross-sectional view of the memory cell array structure taken along the line Y1 of FIG. 1 according to one embodiment of the present invention.
Figure 2D:
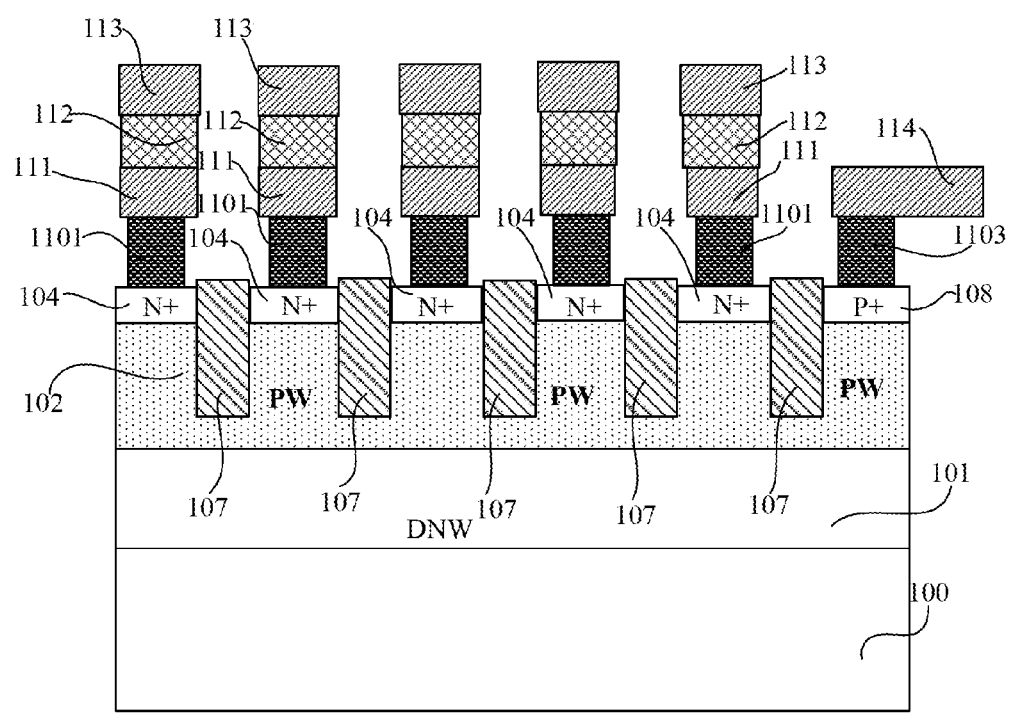
FIG. 2D illustrate a simplified cross-sectional view of the memory cell array structure taken along the line Y2 of FIG. 1 according to one embodiment of the present invention.
Figure 3:
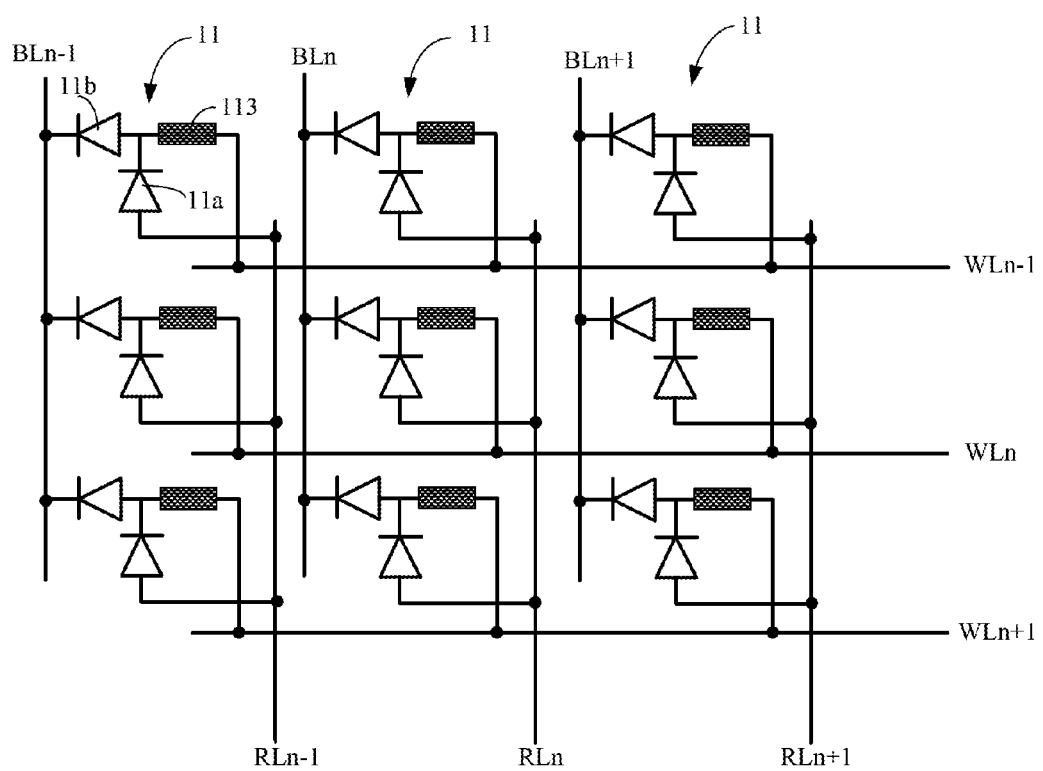
FIG. 3 illustrates a circuit diagram of a memory cell array according to one embodiment of the present invention.

FIG. 1 is a top view of a memory cell array structure 10 according to one embodiment of the present invention. FIG. 2A illustrate a simplified cross-sectional view of the memory cell array structure taken along the line X1 of FIG. 1 according to one embodiment of the present invention. FIG. 2B illustrate a simplified cross-sectional view of the memory cell array structure taken along the line X2 of FIG. 1 according to one embodiment of the present invention. FIG. 2C illustrate a simplified cross-sectional view of the memory cell array structure taken along the line Y1 of FIG. 1 according to one embodiment of the present invention. FIG. 2D illustrate a simplified cross-sectional view of the memory cell array structure taken along the line Y2 of FIG. 1 according to one embodiment of the present invention. FIG. 3 illustrates a circuit diagram of a portion of a memory cell array according to one embodiment of the present invention.

In one embodiment of the present invention, memory cell array structure 10 may include a semiconductor substrate 100. Semiconductor substrate 100 may be an undoped monocrystalline silicon, a monocrystalline silicon doped with an impurity, a silicon on insulator (SOI), stacked SOI (SSOI), stacked SiGe on insulator (S-SiGeOI), SiGe on insulator (SiGeOI), Ge on insulator (GeOI), or the like. In an exemplary embodiment, semiconductor substrate 100 is a monocrystalline silicon substrate.

In a preferable embodiment, semiconductor substrate 100 may have a first conductivity type, e.g., the first conductivity type may be P-type or N-type, and a specific selection may be made according to the type of the device.

It is to be noted that, in the following disclosure, the first conductivity type is P-type, the second conductivity type is N-type. Conversely, the first conductivity type is N-type, the second conductivity type is P-type. Hereinafter, embodiments of the present invention will be described in detail with reference to the case where the first conductivity type is P-type, and the second conductivity type is N-type.

Referring to FIG. 1, memory cell array structure 10 may include a plurality of memory cells 11 provided on semiconductor substrate 100 and arranged in m rows and n columns, where m and n are positive integers.

It is to be noted that, in the present invention, the rows and columns are referred to two mutually perpendicular directions on the surface of the semiconductor substrate.

Illustratively, each of the memory cells 11 includes a first diode, a second diode, and a random access memory component.

Referring to FIGS. 2A through 2D, memory cell array structure 10 may further include n columns of first well regions 102 and n columns of second well regions 103, each of first well regions 102 and each of second well regions extend along the direction of the column, and first and second well regions 102, 103 are arranged alternatively in semiconductor substrate 102 along the row direction. First well regions 102 have a first conductivity type, second well regions 103 have a second conductivity type. Memory cells 11 are formed on first well regions 102 and second well regions 103. Illustratively, first well regions are P-type well regions, and second well regions are N-type well regions.

In one embodiment, when semiconductor substrate 100 has the first conductivity type, an isolation well region 101 is provided in semiconductor substrate 100 to isolate semiconductor substrate 100 from first and second well regions 102 and 103. Isolation well region 101 has the second conductivity type and is located below first well regions 102 and second well regions 103. Preferably, the top portion of isolation well region 101 is in the proximity of the bottom of first well regions 102 and second well regions 103. When semiconductor substrate 100 is a P-type substrate, first well regions 102 are P-type well regions, second well regions 103 are N-type well regions, and isolation well region 101 is an N-type isolation well region to isolate the first well regions from the semiconductor substrate.

In one embodiment, a deep trench structure 106 is provided between adjacent first well regions 102 and second regions 103 to isolate first well regions 102 from second regions 103. Deep trench structure 106 has a length extending along the column direction to completely isolate first well regions 102 from second regions 103. Deep trench structure 106 is disposed in semiconductor substrate 100 and has an upper surface that is slightly higher than the upper surface of semiconductor substrate 100, or the an upper surface of deep trench structure 106 is flush with the upper surface of semiconductor substrate 100, and deep trench structure 106 has a bottom lower than the bottom of first well regions 102 and second regions 103. When deep trench structure 106 is provided, the bottom of trench structure 106 is lower than the bottom of isolation well region 101.

Deep trench structure 106 includes a deep trench filled with a deep trench isolation material including silicon nitride, silicon oxide, or silicon oxynitride.

Memory cell array structure 10 may also include a plurality of first doped regions 104 disposed in first well regions 102 and having the second conductivity type. Each one of first doped regions 104 is disposed in one of first well regions 102 along the column direction, one of first doped regions 104 and one of first well regions 102 form a first diode 11a. First diode 11a is a constituent element of a memory cell. The number of first doped regions 104 disposed in the first well regions is determined by the size of the memory cell array, e.g., when the memory cell array has m rows and n columns, the number of first doped regions 104 disposed in one of first well regions 102 is also m.

By way of example, first well regions 102 are P-type well regions, first doped regions 104 are N-type doped regions, which are N-type heavily doped regions (referred to as N+), i.e., a first doped region 104 and the corresponding first well region 102 underneath thereof form first diode 11a. The P-type well region is the anode of first diode 11a, and the N-type heavily doped region is the cathode of first diode 11a. Since the plurality of first diodes 11a share a P-type well region, the anodes of the plurality of first diodes 11a sharing the P-type well region in the same column are electrically connected together.

Memory cell array structure 10 may also include a plurality of second doped regions 105 disposed in second well regions 103 and having the first conductivity type. Each one of the plurality of second doped regions 105 are disposed in one of second well regions 103 along the column direction, one of second doped regions 105 and one of second well regions 103 form a second diode 11b. Second diode 11b is a constituent element of the memory cell. The number of second doped regions 105 arranged in the second well region is determined by the size of the memory cell array, e.g., when the memory cell array has m rows and n columns, the number of second doped regions 105 disposed in one of second well regions 103 is also m.

Preferably, first doped region 104 and second doped region 105 are arranged in m rows in the row direction, and first doped regions 104 and second doped regions 105 are arranged alternatively in the same row.

By way of example, second well regions 103 are N-type well regions, second doped regions 105 are P-type doped regions, which are P-type heavily doped regions (referred to as P+), i.e., second doped regions 105 and corresponding first well regions 102 underneath thereof form second diodes 11b. The P-type well regions are the anodes of second diodes 11b, and the N-type heavily doped regions are the cathodes of second diode 11b. Since the plurality of second diodes 11b share an N-type well region, the cathodes of the plurality of first diodes 11b sharing the N-type well region in the same the column are electrically connected together.

Further, first diodes 11a and second diodes 11b of adjacent columns in the same row constitute the elements of the memory cells, and the different memory cells on the same row do not share a common first diode 11a and a common second diode 11b.

Referring to FIG. 2D, memory cell array structure 10 may further include a plurality of third doping regions 108 having the same conductivity type as first well regions 102, and at least one of the plurality of third doped regions 108 is provided in one of first well regions 102, and third doped regions 108 are isolated from adjacent first doped regions 104.

One of third doped region 108 in one of first well regions 102 serves as a lead-out region of that one of first well regions 102 to electrically connected that one of first well regions 102 to an external circuit. First well regions 102 can be considered as reset lines provided in the semiconductor substrate.

In a preferred embodiment, third doped regions 108 in one of first well regions 102 are located at one end of the first well regions in the vicinity of an outer edge of the memory cell array structure.

By way of example, third doped regions 108 are P-type doped regions, preferably a P-type heavily doped region (P+), when first well regions 102 are P-type well regions.

Referring to FIG. 2C, memory cell array structure 10 may further include a plurality of fourth doping regions 109 having the same conductivity type as that of second well regions 103, and at least one of the plurality of fourth doped regions 109 is provided in one of second well regions 103, and fourth doped regions 109 and adjacent second doped regions 105 are isolated from each other.

One of fourth doped regions 109 in one of second well regions 103 serves as a lead-out region of that one of second well regions 102 to electrically connected that one of second well regions 103 to an external circuit. Second well regions 103 can be considered as bit lines provided in the semiconductor substrate.

By way of example, fourth doped regions 109 are N-type doped regions, preferably an N-type heavily doped region (N+), when second well regions 103 are N-type well region.

In a preferred embodiment, fourth doped regions 109 in one of second well regions 103 are located at one end of second well regions 103 in the vicinity of an outer edge of the memory cell array structure.

Further, third doped regions 108 and fourth doped regions 109 may be both in the vicinity of the same outer edge of the memory cell array structure, and third doped regions 108 and fourth doped regions 109 are alternatively arranged along the row direction.

In one embodiment, a shallow trench isolation structure 107 is provided between adjacent ones of first doped regions 104 located in the same first well region 102, between adjacent ones of second doped regions 105 located in the same second well region 103, between adjacent third doped region 108 and first doped region 104, between adjacent fourth doped region 109 and second doped region 107. Shallow trench isolation structure 107 has a bottom that is higher than the bottom of first well region 102 and second well region 103, and lower than the bottom of first doped region 104, the second doped region 105, third doped region 108, and fourth doped region 109. Shallow trench isolation structure 107 insulates adjacent first doped region 104, adjacent second doped regions 105, adjacent third doped region 108 and first doped region 104, and adjacent fourth doped region 109 and second doped region 105.

Referring back to FIG. 2A, the memory cell array of the present invention may further include a plurality of random aces memory components 112 disposed on semiconductor substrate 100 and having a bottom electrically connected to first doped region 104 and second doped region 105 of the memory cell.

In one embodiment, still referring to FIG. 2A, an interconnect metal layer 111 is disposed on semiconductor substrate 100 under each one of the plurality of random aces memory components 112. A first contact hole 1101 and a second contact hole 1102 are disposed below interconnect metal layer 111, first contact hole 1101 is electrically connected to first doped region 104 and interconnect metal layer 111, second contact hole 1102 is electrically connected to second doped region 105 and interconnect metal layer 111, and interconnect metal layer 111 is electrically connected to the bottom of the random access memory components 112.

Further, interconnect metal layer 111 is electrically connected to different ones of the random access memory components 112 that are insulated from each other.

The memory cell array of the present invention may further include m rows of word lines 113 disposed above the random access memory components 112 and parallel to each other. The random access memory components 112 disposed in the same row have the top that is connected to the same word line 113, i.e., each row of the memory cells corresponds to a row of word lines 113, the memory cells of random access memory components 112 disposed in a same row have the top electrically connected to a word line 113 of the corresponding row, each word line 113 extends along the row direction.

Word lines 113 may include any suitable conductive material, such as a metal material or a semiconductor material. The metal material may include copper, aluminum, or the like.

By way of example, random aces memory components 112 may be any type of random access memory known to those of skill in the art. For example, random aces memory components 112 may be a resistive random access memory (RRAM), a phase change random access memory (PCRAM), or a magnetic random access memory (MRAM).

In a preferred embodiment, random aces memory components 112 is a resistive random access memory.

A resistive random access memory may use the variable resistance characteristics of the transition metal oxide (e.g., the resistance value varies with voltage) to store data.

An RRAM has two or more states with different resistance values, which correspond to different digital values. By applying a predetermined voltage or current to the RRAM, the RRAM switches from one state to another. For example, the RRAM has a relatively high resistance value (referred to as a "high-resistance state") and a relatively low state (referred to as a "low-resistance state"). By applying a predetermined voltage or current to the electrode, the RRAM can switch from a high-resistance state to a low-resistance state, or from a low-resistance state to a high-resistance state.

In one embodiment, the resistive random access memory may include a bottom electrode disposed on interconnect metal layer 111, a resistive material layer disposed on the bottom electrode, and a top electrode disposed on the resistive material layer. The bottom electrode is electrically connected to interconnect meta layer 111, the top electrode is electrically connected to a word line 113, and further, the bottom electrode can be in direct contact with interconnect metal layer 111 to obtain an electrical connection.

The bottom electrode may be made of gold (Au), platinum (Pt), ruthenium (Ru), iridium (Ir), titanium (Ti), aluminum (Al), copper (Cu), tantalum (Ta), tungsten (W), iridium-tantalum (Ir-Ta) alloy, or indium tin oxide (ITO). The bottom electrode may also be made of oxide, nitride, fluoride, carbide, boride, or silicide, such as TaN, TiN, TiAlN, TiW, or a combination thereof. In one embodiment, the bottom electrode includes a tantalum nitride layer and a titanium nitride layer.

The resistive material layer is formed on the bottom electrode and in direct contact with the bottom electrode. The resistive material layer has a thickness between about 20 nm and about 100 nm. The resistive material layer may include an oxide of one or more of Ta, Ti, Ni, Co, Hf, Ru, Zr, Zn, Fe, Sn, Al, Cu, Ag, Mo, and Cr. In some embodiments, silicon may be included in the resistive material layer to form the composite material. In some embodiments, the resistive material layer may include hafnium oxide and/or zirconium oxide.

A protective layer may be selectively provided on the resistive material layer. In various embodiments, the protective layer is a metal, such as titanium, hafnium, platinum, and tantalum. The protective layer has a thickness between about 20 angstroms and about 150 angstroms, preferably between about 40 angstroms and about 80 angstroms.

The top electrode is provided on the resistive material layer or the optional protective layer. The top electrode may be made of gold (Au), platinum (Pt), ruthenium (Ru), iridium (Ir), titanium (Ti), aluminum (Al), copper (Cu), tantalum (Ta), tungsten (W), iridium-tantalum (Ir-Ta) alloy, or indium tin oxide (ITO). The top electrode may also be made of oxide, nitride, fluoride, carbide, boride, or silicide, such as TaN, TiN, TiAlN, TiW, or a combination thereof. The top electrode has a thickness between about 100 nm and about 500 nm.

The memory cell array of the present invention may further include n columns of reset lines 114, each of reset lines 114 is disposed on a column of third doped region 108, the reset lines are insulated from each other and are electrically connected to corresponding third doped regions 108 underneath thereof.

Further, each of reset lines 114 extends along the column direction toward an outer edge of the memory cell array structure, the outer edge is the edge in the vicinity of third doped region 108.

By way of example, each of reset lines 114 is electrically connected to third doped region 108 underneath thereof through third contact hole 1103 disposed on semiconductor substrate 100.

The memory cell array of the present invention may further include n columns of bit lines 115, each of bit lines 115 is disposed on a column of fourth doped region 109, the bit lines are insulated from each other and are electrically connected to corresponding fourth doped regions 109 underneath thereof.

In one embodiment, each of bit lines 115 is electrically connected to fourth doped region 108 below through fourth contact hole 1104 disposed on semiconductor substrate 100.

Further, each of bit lines 115 extends along the column direction toward an outer edge of the memory cell array structure, the outer edge is the edge of fourth doped region 109.

Further, reset lines 114 and bit lines 115 are parallel to each other.

Comparing with bit lines and reset lines extending in the direction of the entire column in a conventional design, reset lines 114 and bit lines 115 according to embodiments of the present invention only require to extend a small length at the edge of the memory cell array structure to obtain the same function with a reduced area required for the reset lines and bit lines.

It is to be noted that first contact hole 1101, second contact hole 1102, third contact hole 1103, and fourth contact hole 1104 described above may be any conductive contact holes. In an example embodiment, the contact holes may be made of copper, aluminum, or tungsten, or the like. An interconnect metal structure, e.g., copper interconnect metal structure, may be used instead of first contact hole 1101, second contact hole 1102, third contact hole 1103, and fourth contact hole 1104 to implement the electrical connection of the diodes and reset lines 114, bit lines 115, or interconnect metal layer 111 disposed on the diodes.

It is to be noted that reset lines 114, bit lines 115, or interconnect metal layer 111 may be formed on the same plane, that is, reset lines 114, bit lines 115, or interconnect metal layer 111 may be formed with a same conductive layer using a lithography process and an etching process. The same conductive layer can include any suitable conductive material, such as a metal material or a semiconductor material. The metal material may include, but not limited to, copper (Cu), aluminum (Al), or the like. The semiconductor material may include, but not limited to, doped or undoped polysilicon.

It is to be noted that the memory cell array of the present invention may further include other components or layer structures, e.g., a multilayer dielectric layer may be formed in the interlayer dielectric layer, that may include, for example, SiO$_2$, fluorocarbon (CF), carbon-doped silicon oxide (SiOC), or a silicon carbon nitride (SiCN). Alternatively, the dielectric layer may include an SiCN layer on a fluorocarbon (CF) layer. Or, the dielectric layer may include fluorocarbon containing fluorine (F) and carbon (C) as the main components, the fluorocarbon may include an amorphous (non-crystalline) structure. Or, the dielectric layer may include a porous structure such as carbon doped silicon oxide (SiOC).

FIG. 3 is a circuit diagram of a memory cell array according to one embodiment of the present invention. The circuit diagram is an equivalent circuit diagram of the memory cell array structure of FIG. 1. By way of example, memory cell array structure according to the present invention may include m rows and n columns of memory cells 11, each of memory cells 11 includes a first diode 11a, a second diode 11b, and a random access memory component 113. First diode 11a and random access memory component 113 are connected in series between a reset line (RL) and a word line (WL), a current flowing through first diode 11a and random access memory component 113 forms a reset path. Second diode 11b and random access memory component 113 are connected in series between a word line (WL) and a bit line (BL), a current flowing through second diode 11b and random access memory component 113 forms a set path.

Referring to FIG. 3, the cathode of first diode 11a and the anode of second diode 11b in each of memory cells 11 are electrically connected to one end of random access memory component 113, the cathodes of second diodes 11b of memory cells 11 disposed in the same column are electrically connected to the bit line BL of that column. From left to right, the cathodes of second diodes 11b of the three memory cells 11 in the (n-1)th column are electrically connected to the bit line BLn-1 of that column in which they are located. The cathodes of second diodes 11b of the three memory cells 11 in the n-th column are electrically connected to the bit line BLn of that column in which they are located. The cathodes of second diodes 11b of the three memory cells 11 in the (n+1)th column are electrically connected to the bit line BLn+1 of that column in which they are located, and so forth.

Further, from left to right, the anodes of first diodes 11a of memory cells 11 disposed in the same (n-1)th column are electronically connected to the reset line RLn-1 of that column. The anodes of first diodes 11a of memory cells 11 disposed in the same (n)th column are electronically connected to the reset line RLn of that column. T anodes of first diodes 11a of memory cells 11 disposed in the same (n+1)th column are electronically connected to the reset line RLn+1 of that column, and so forth.

Further, the other end of random access memory component 113 of memory cells 11 in the same row is electrically connected to the word line WL. As shown in FIG. 3, from top to bottom, the other ends of random access memory cells 11 of the (n-1)th row are electrically connected to the word line WLn-1 of that row. The other ends of random access memory cells 11 of the (n)th row are electrically connected to the word line WLn of that row. The other ends of random access memory cells 11 of the (n+1)th row are electrically connected to the word line WLn+1 of that row, and so forth.

The number m and n can be any positive integers. Although only a portion of the memory cell array is shown in FIG. 3, one of skill in the art will appreciate that other sizes of memory cell array structures are equally within the scope of the present invention. For the sake of simplicity, only one memory cell 11 is labeled, it is however contemplated that other memory cells 11 also include a first diode 11a, a second diode 11b, and a random access memory component 113.

Specifically, the operation of the memory cell array according to the present invention is shown in the following Table:

| | selected | | | unselected | | |
|---|---|---|---|---|---|---|
| | Word line | Bit line | Reset line | Word line | Bit line | Reset line |
| SET | Vset | 0V | floating | floating | floating | floating |
| RESET | 0V | floating | Vreset | floating | floating | 0V |
| Read | Vread | 0V | floating | floating | floating | floating |

The memory cell array of the present invention operates in a manner that, when the memory cell array is selected, the word line is connected to a set voltage (Vset), the bit line is connected to a low voltage (e.g., 0V), the reset line is in a floating state, a current flowing from the word line through second diode 11b and random access memory component 113 to the bit line performs a SET operation. When the word line is connected to a low voltage (e.g., 0V), the bit line is in a floating state, the reset line is connected to a reset voltage (Vreset), a current flowing from first diode 11a and random access memory component 113 to the word line performs a RESET operation. When the word line is connected to a read voltage (Vread), the bit line is connected to a low voltage (e.g., 0V), the reset line is in a floating state, a current flowing from the word line through second diode 11b and random access memory component 113 to the bit line performs a Read operation.

When the memory cell array is unselected, when a SET operation is performed, the word line, the bit line and the reset line are in a floating state. When a RESET operation is performed, the word line and the bit line are in a floating state, the reset line is connected to a low voltage (e.g., 0V). When a read operation is performed, the word line, the bit line and the reset line are in a floating state.

Thus, the memory cell array structure according to embodiments of the present invention includes a plurality of memory cells, each having two diodes and a resistive random access memory component. The memory cell array structure can realize the requirement of bipolar RRAM, with one of the diodes being used to implement the read operation and the set operation, and the other diode being used to implement the reset operation.

In summary, the memory cell array structure according to embodiments of the present invention includes m rows and n columns of memory cells formed in a semiconductor substrate, each of the memory cells having a pitch of 4F extending along the word line direction, and a pitch of 2F extending along the bit line direction, so that each memory cell has a size of $4F \times 2F = 8F^2$, where F is the feature size of the device. Thus, a 2D1R memory cell array structure is implemented on a silicon substrate.

In the memory cell array structure according to embodiments of the present invention, the first well region of memory cells disposed in a same column serves as the bit line of those memory cells in the same column, the third well region disposed in each of the first well regions is provided as a conductive lead line to electrically connect to a bit line above a corresponding first well region. A second well region of memory cells disposed in the same column is provided as a reset line of the memory cells in the same column, the fourth doped region disposed in each of the second well region is provided as a conductive lead line to electrically connect to a reset line above the second well region. In accordance with the present invention, the memory cell array structure directly uses the first well region and the second well region disposed in the substrate as the bit line and the reset line, respectively, to reduce the area of the bit line and the reset line on the semiconductor substrate, thereby significantly reducing the size of the memory cell array structure.

Embodiment 2

Embodiments of the present invention also provide an electronic device including the memory cell array structure described in the sections above.

An electronic device, in accordance with a second embodiment of the present invention, may include the semiconductor device as described in the first embodiment, which may be manufactured according to the memory cell array structure described in the first embodiment. Because the semiconductor device according to the embodiment described above has a reduced size of memory cell array structure, the electronic device according to this embodiment also includes the advantages described above.

The electronic device may be a mobile phone, tablet PC, laptop, netbook, game console, DVD player, GPS device, voice recorder, MP3, MP4, PSP, or other electronic products.

Figure 4:
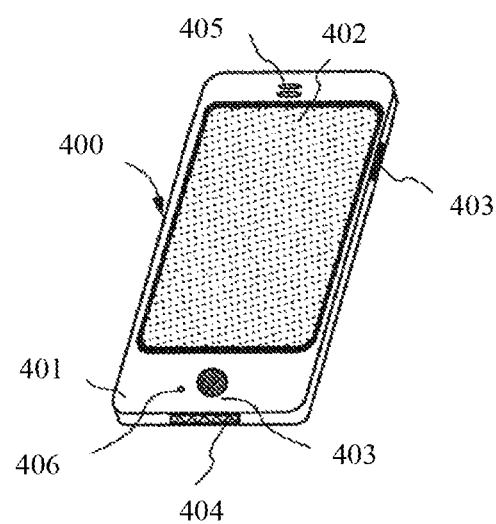
FIG. 4 is a schematic diagram of an electronic device according to one embodiment of the present invention.

FIG. 4 is an example of a mobile phone handset 400. Mobile phone handset 400 may include a housing 401, a display portion 402, an operation button 403, an external connection port 404, a speaker 405, a microphone 406, and a semiconductor device, and others.

The semiconductor device includes a memory cell array structure as described in embodiment 1. The memory cell array structure may include a semiconductor substrate, a plurality of memory cells arranged in m rows and n columns on the semiconductor substrate, where m and n are positive integers. Each of the plurality of memory cells includes a first diode, a second diode, and a random access memory component. The memory cell array structure may further include n columns of first well regions and n columns of second well regions, each of the first and second well regions extends along the column direction and alternatively disposed in the semiconductor substrate along the row direction. The first well regions have a first conductivity type, and the second well regions have a second conductivity type different from the first conductivity type.

The memory cell array structure may further include a plurality (e.g., m rows) of first doped regions in the first well regions and having the second conductivity type, each one of the first doped regions is disposed in one of the first well regions along the column direction, one of the first doped regions and one first well region underneath the corresponding one of the first doped regions form a first diode.

The memory cell array structure may further include a plurality (e.g., m rows) of second doped regions in the second well regions and having the first conductivity type, each one of the second doped regions is disposed in one of the second well regions along the column direction, one of the second doped regions and one second well region underneath the corresponding one of the second doped regions form a second diode.

The memory cell array structure may further include a plurality of third doped regions having the same conductivity type as the first well region, at least one of the third doped regions being provided in one of the first well regions, and the third doped regions are insulated from adjacent first doped regions.

The memory cell array structure may further include a plurality of fourth doped regions having the same conductivity type as the second well region, at least one of the fourth doped regions being provided in one of the second well regions, and the fourth doped regions are insulated from adjacent second doped regions.

The memory cell array structure may further include a plurality of random access memory components disposed on the semiconductor substrate, each of the random access memory components having a bottom that is electrically connected to one of the first doped regions and one of the second doped region of a corresponding memory cell.

The memory cell array structure may further include m rows of word lines disposed on the random access memory components and spaced apart from each other and parallel to each other, the random access memory components of the memory cells located in the same row have a top electrically connected to the same word line.

The memory cell array structure may further include n columns of reset lines disposed on third doped regions of a same column, the reset lines are insulated from each other, and each one of the reset lines is electrically connected to a third doped region below the corresponding one of the reset lines of the same column.

The memory cell array structure may further include n columns of bit lines disposed on fourth doped regions of a same column, the bit lines are insulated from each other, and each one of the bit lines is electrically connected to a fourth doped region below the corresponding one of the bit lines of the same column.

The memory cell array structure according to embodiments of the present invention includes m rows and n columns of memory cells formed in a semiconductor substrate, each of the memory cells having a pitch of 4F extending along the word line direction (row direction), and a pitch of 2F extending along the bit line direction (column direction), so that each memory cell has a size of $4F \times 2F = 8F^2$, where F is the feature size of the device. Thus, a 2D1R memory cell array structure is implemented on a silicon substrate.

Further, the memory cell array structure according to embodiments of the present invention includes a first well region of memory cells disposed in a same column and configured to be the bit line of those memory cells in the same column, the third well region disposed in one of the first well regions is provided as a conductive lead-out line to electrically connect to a bit line above a corresponding first well region. A second well region of memory cells disposed in a same column is provided as a reset line of the memory cells in the same column, the fourth doped region disposed in one of the second well region is provided as a conductive lead-out line to electrically connect to a reset line above the corresponding second well region. In accordance with the present invention, the memory cell array structure directly uses the first well regions and the second well regions disposed in the substrate as the bit lines and the reset lines, respectively, to reduce the area of the bit lines and the reset lines on the semiconductor substrate, thereby significantly reducing the size of the memory cell array structure.

Because the electronic device of the present invention includes the above-described memory cell array structure, the electronic device also has the advantages of the memory cell array structure described above.

The preferred embodiments of the present invention have been described for illustrative purposes, and those skilled in the art will appreciate that various modifications, additions and substitutions are possible, without departing from the scope and spirit of the invention as disclosed in the appended claims.

What is claimed is:

1. A memory cell array structure, comprising:
   a semiconductor substrate;
   a plurality of memory cells arranged in m rows and n columns on the semiconductor substrate, m and n being positive integers, each of the memory cells including a first diode, a second diode, and a random access memory component;
n columns of first well regions and n columns of second well regions spaced apart from each other in the semiconductor substrate and alternatively disposed along a column direction, the first well regions having a first conductivity type, and the second well regions having a second conductivity type different from the first conductivity type;
m rows of first doped regions in the first well regions and having the second conductivity type, each one of first doped regions disposed in one of the first well regions along the column direction, one of the first doped regions and one of the first well regions disposed underneath thereof forming a first diode;
m rows of second doped regions in the second well regions and having the first conductivity type, each one of second doped regions disposed in one of the second well regions along the column direction, one of the second doped regions and one of the second well regions disposed underneath thereof forming a second diode;
a plurality of third doping regions having the first conductivity type of the first well regions, at least one of the third doped regions disposed in one of the first well regions, and the third doped regions being isolated from adjacent first doped regions;
a plurality of fourth doping regions having the second conductivity type of the second well regions, at least one of the fourth doped regions disposed in one of the second well regions, and the fourth doped regions being isolated from adjacent second doped regions;
a plurality of random access memory components disposed on the semiconductor substrate, each of the random access memory components having a bottom electrically connected to one of the first doped regions and one of the second doped regions;
m rows of word lines on the random access memory components, spaced apart from each other and parallel to each other, each of the random access memory components having a top electrically connected to a same word line;
n columns of reset lines each on third doped region in a same column and electrically connected to the third doped regions in the same column and underneath thereof, the rest lines being isolated from each other;
n columns of bit lines each on fourth doped regions in a same column and electrically connected to the fourth doped regions in the same column and underneath thereof, the bit lines being isolated from each other.

2. The memory cell array structure of claim 1, wherein one of the third doped regions in one of the first well regions is disposed at one end of the one of the first well regions.

3. The memory cell array structure of claim 2, wherein one of the fourth doped regions in one of the second well regions is disposed at one end of the one of the second well regions.

4. The memory cell array structure of claim 3, wherein the third doped regions and the fourth doped regions are alternatively arranged in the row direction.

5. The memory cell array structure of claim 1, further comprising a deep trench isolation structure between adjacent first well regions and second well regions, the deep trench isolation structure extending along the column direction in the semiconductor substrate and having a bottom lower than a bottom of the first well regions and a bottom of the second well regions.

6. The memory cell array structure of claim 1, further comprising a shallow trench isolation structure between adjacent first doped regions in a same first well region, between adjacent third doped regions and first doped regions, between adjacent second doped regions in a same second well region, and between the fourth doped regions and the second doped regions, the shallow trench isolation structure having a bottom higher than a bottom of the first well regions and a bottom of the second well regions.

7. The memory cell array structure of claim 1, further comprising an isolation well region having the second conductivity type, the isolation well region being disposed below the first well regions and the second well regions.

8. The memory cell array structure of claim 7, wherein the isolation well region has an upper portion adjacent to a bottom of the first well regions and a bottom of the second well regions.

9. The memory cell array structure of claim 1, wherein then columns of reset lines each extend along the column direction toward an outer edge of the memory cell array structure.

10. The memory cell array structure of claim 1, wherein the n columns of bit lines each extend along the column direction toward an outer edge of the memory cell array structure.

11. The memory cell array structure of claim 1, wherein the first conductivity type is P-type and the second conductivity type is N-type; or, the first conductivity type is N-type and the second conductivity type is P-type.

12. The memory cell array structure of claim 1, wherein the random access memory component is one of a resistive random access memory, a phase-charge random access memory, or a magnetic random access memory.

13. The memory cell array structure of claim 1, further comprising:
an interconnect metal layer disposed on the semiconductor substrate and below the random access memory component and electrically connected to a bottom of the random access memory component;
a first contact hole and a second contact hole below the interconnect metal layer and isolated from each other, the first contact hole being electrically connected between one of the first doped regions and the interconnect metal layer, the second contact hole being electrically connected between one of the second doped regions and the interconnect metal layer.

14. The memory cell array structure of claim 13, wherein the interconnect metal layer is electrically connected to different ones of the random access memory components.

15. The memory cell array structure of claim 1, wherein each of the reset lines is electrically connected to a corresponding third doped region disposed underneath thereof through a third contact hole on the semiconductor substrate.

16. The memory cell array structure of claim 1, wherein each of the bit lines is electrically connected to a corresponding fourth doped region disposed underneath thereof through a fourth contact hole on the semiconductor substrate.

17. The memory cell array structure of claim 1, wherein the reset lines and the bit lines are parallel to each other.

18. The memory cell array structure of claim 1, wherein the semiconductor substrate has the first conductivity type.

19. The memory cell array structure of claim 1, further comprising an isolation well region having the second conductivity type disposed below the first well regions and configured to isolate the first well regions from the semiconductor substrate.

20. An electronic device comprising a memory cell array structure, the memory cell array structure comprising:
   a semiconductor substrate;
   a plurality of memory cells arranged in m rows and n columns on the semiconductor substrate, m and n being positive integers, each of the memory cells including a first diode, a second diode, and a random access memory component;
   n columns of first well regions and n columns of second well regions spaced apart from each other in the semiconductor substrate and alternatively disposed along a column direction, the first well regions having a first conductivity type, and the second well regions having a second conductivity type different from the first conductivity type;
   m rows of first doped regions in the first well regions and having the second conductivity type, each one of first doped regions disposed in one of the first well regions along the column direction, one of the first doped regions and one of the first well regions disposed underneath thereof forming a first diode;
   m rows of second doped regions in the second well regions and having the first conductivity type, each one of second doped regions disposed in one of the second well regions along the column direction, one of the second doped regions and one of the second well regions disposed underneath thereof forming a second diode;
   a plurality of third doping regions having the first conductivity type of the first well regions, at least one of the third doped regions disposed in one of the first well regions, and the third doped regions being isolated from adjacent first doped regions;
   a plurality of fourth doping regions having the second conductivity type of the second well regions, at least one of the fourth doped regions disposed in one of the second well regions, and the fourth doped regions being isolated from adjacent second doped regions;
   a plurality of random access memory components disposed on the semiconductor substrate, each of the random access memory components having a bottom electrically connected to one of the first doped regions and one of the second doped regions;
   m rows of word lines on the random access memory components, spaced apart from each other and parallel to each other, each of the random access memory components having a top electrically connected to a same word line;
   n columns of reset lines each on third doped region in a same column and electrically connected to the third doped regions in the same column and underneath thereof, the rest lines being isolated from each other;
   n columns of bit lines each on fourth doped regions in a same column and electrically connected to the fourth doped regions in the same column and underneath thereof, the bit lines being isolated from each other.

* * * * *